(12) United States Patent
Wong

(10) Patent No.: US 11,569,788 B2
(45) Date of Patent: Jan. 31, 2023

(54) DOHERTY AMPLIFIER DEVICE

(71) Applicant: SUMITOMO ELECTRIC DEVICE INNOVATIONS, INC., Kanagawa (JP)

(72) Inventor: James Wong, Surrey (GB)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 27 days.

(21) Appl. No.: 17/080,035

(22) Filed: Oct. 26, 2020

(65) Prior Publication Data
US 2021/0126596 A1 Apr. 29, 2021

Related U.S. Application Data

(60) Provisional application No. 62/926,720, filed on Oct. 28, 2019.

(51) Int. Cl.
*H03F 3/21* (2006.01)
(52) U.S. Cl.
CPC ........ *H03F 3/211* (2013.01); *H03F 2200/451* (2013.01)
(58) Field of Classification Search
CPC .......................... H03F 3/211; H03F 2200/451

USPC ........................................................ 330/295
See application file for complete search history.

(56) References Cited

U.S. PATENT DOCUMENTS

2020/0067459 A1* 2/2020 Ahmed ............. H01L 23/49811

* cited by examiner

*Primary Examiner* — Hafizur Rahman
(74) *Attorney, Agent, or Firm* — Smith, Gambrell & Russell, LLP.

(57) ABSTRACT

An amplifier device includes a substrate, a composite packaged amplifier having a bottom plate and an output plate, a first amplifier and a second amplifier provided on the bottom plate, a combining node that combines an output of the first amplifier with an output of the second amplifier, an output matching circuits provided on the bottom plate, that has a first transmission line provided between the first amplifier and the combining node, and a second transmission line provided between the combining node and the second amplifier, a third transmission line having one transmission line on which the output plate is mounted and other transmission line that connects the one transmission line to the external port, and wirings connecting to one terminal of the output plate and the combining node. A length of the output plate and the other transmission line is equal or less than π/4 radian for a signal.

6 Claims, 7 Drawing Sheets

DOHERTY AMPLIFIER DEVICE

CROSS-REFERENCE TO RELATED APPLICATIONS

This application claims the priority under 35 U.S.C. § 119 of U.S. Provisional Application Ser. No. 62/926,720, filed on Oct. 28, 2019; the contents of which are relied upon and incorporated herein by reference in its/their entirety.

TECHNICAL FIELD

The present application relates to a Doherty amplifier device.

BACKGROUND

Using a standard Doherty amplifier with identically sized active devices as an example, in particular the output $\lambda/4$ transformers as illustrated in FIG. 4. Table 1 shows a list of associated impedance matches required for different transformer profiles.

TABLE 1

|  | TX1 (Ω) | TX2 (Ω) | Main Termination | Peak Termination |
|---|---|---|---|---|
| Classic Approach #1 | 35.35 | 35.35 | 50 | 50 |
| Classic Approach #2 | 35.35 | 50 | 100 | 50 |
| Alternate Approach #1 | 50 | 50 | 50 | 100 |
| Alternate Approach #2 | 40 | 50 | 78 | 64 |
| Alternate Approach #3 | 50 | 40 | 32 | 100 |

Based on the design constraints, one can therefore correlate Tables 1 to determine the most suitable substrate and impedances necessary to design a composite packaged Doherty amplifier.

The demands for compact amplifier designs and transmitting solutions necessitate a more elegant yet integrated solution.

In conventional amplifier designs in FIG. 5, a packaged transistor forms the active device with the associated input and output matching networks forming the passive components. However, as demand for transmitting power increases in addition to a smaller design footprint, it becomes necessary to desegregate these elements and combine them into a single entity.

SUMMARY

The present embodiment provides a Doherty amplifier device that amplifies an input radio frequency (RF) signal. The Doherty amplifier device having a back-off level that is smaller than a preset amount from saturated power in an output thereof, includes a substrate, a composite packaged amplifier which has a bottom plate and an output plate on the substrate, a carrier amplifier for amplifying the input RF signal, which saturates output power thereof at the back-off level, and is provided on the bottom plate, a peak amplifier configured to show a substantial leak when the Doherty amplifier in an output thereof is smaller than the back-off level, which turns on at the back-off level, and saturates an output thereof at the saturate power, and is provided on the bottom plate, a combining node that combines an output of the carrier amplifier with the peak amplifier, an output matching circuits which has the first transmission line and the second transmission line, a third transmission line provided on the substrate, which has one transmission line and other transmission line. The first transmission line is provided between the carrier amplifier and the combining node. The second transmission line is provided between the combining node and the peak amplifier, and the output plate has one terminal and end terminal connecting to the external port via the other transmission line, and is mounted on the one transmission line on. The output plate and the third transmission line have an electrical length of less than $\pi/4$ radian for a signal subject to the Doherty amplifier device.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, some embodiments of a Doherty amplifier device according to the present application will be described in detail. In the description of the drawings, numerals or symbols same with or similar to each other will refer to elements same with or similar to each other without duplicating explanations.

Figure 1A:
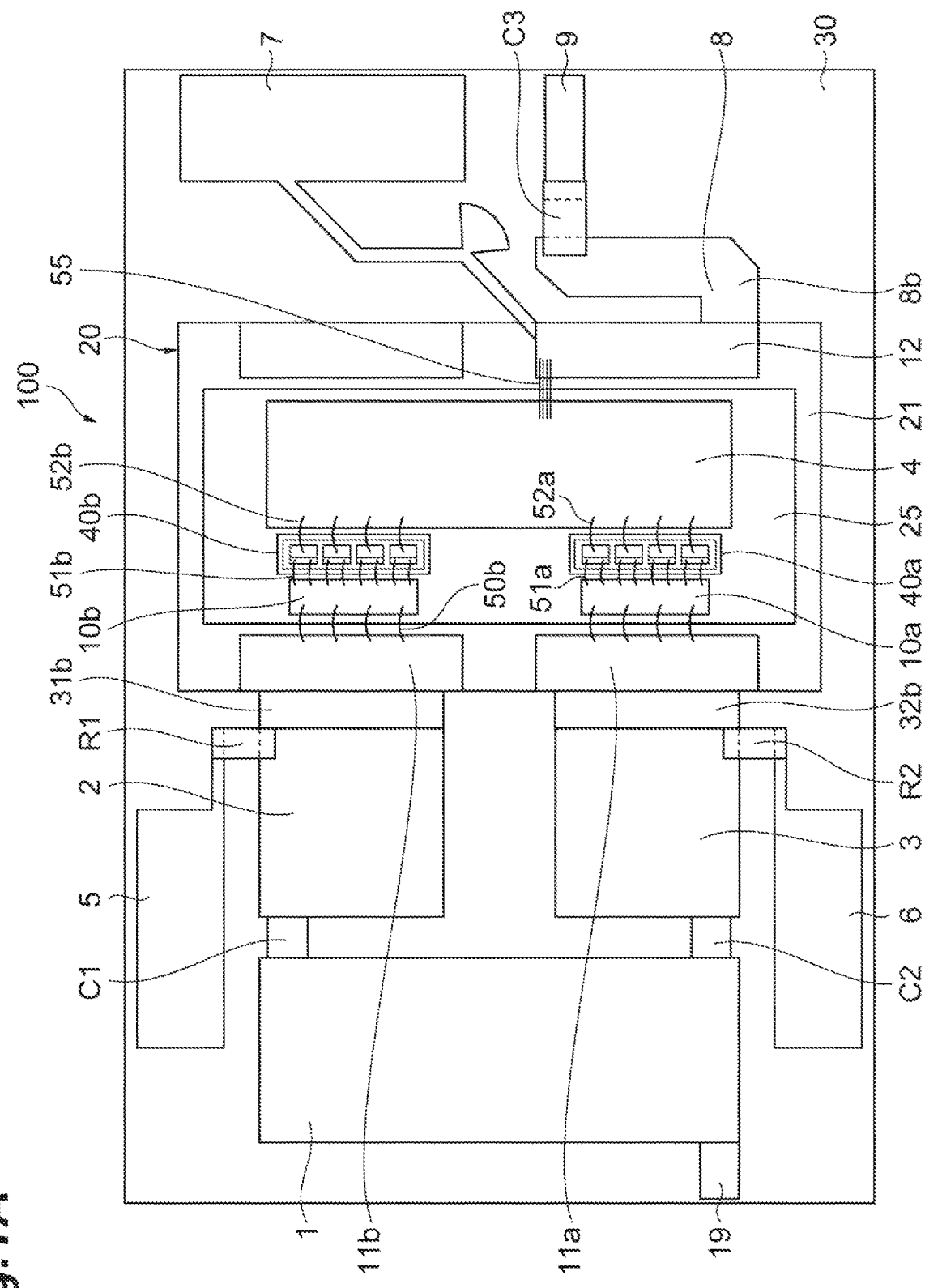
FIG. 1A shows a configuration of a composite packaged amplifier device of the present invention.

A practical implementation of Doherty amplifier device is a composite packaged amplifier illustrated in FIG. 1A. The illustrated dimensions are 30 mm×25 mm.

Alternate approach #2 (shown in Table 1) together with a printed circuit board (PCB) substrate of 0.508 mm thick is used in this insulation material. Then, for example, the PCB substrate 30 is made of material of an composite epoxy and so on, and its permittivity is 3.0 or more.

The composite packaged amplifier device has the PCB substrate 30, a composite packaged amplifier 20, an Input RF power split 1, a Main path input matching network 2, a Peak path input matching network 3.

The composite packaged amplifier 20, the Input RF power split 1, the Main path input matching network 2 and the Peak path input matching network are provided on the PCB substrate 30.

The PCB substrate 30 has, an input Main path 5, an input Peak path 6, output Main and Peak Paths 7, a Final transformer 8, an Output RF path 9, an Input RF path 19 and a ground pattern 60 provided on a main face of the PCB substrate 30, and a ground metal 65 provided on a rear face of the PCB substrate 30.

The Final transformer 8 is such as a microstrip line. The microstrip line provided on the PCB substrate 30 has the ground metal in a rear face of the PCB substrate 30.

The Input RF power split 1 such as 3 dB hybrid coupler component is connected to the input RF path 19. The Main path input matching network 2 is arranged between the Input RF power split 1 and the composite packaged amplifier 20. The Main path input matching network 2 is connected to the Input RF power split 1 via a first capacitor C1, is connected to the composite packaged amplifier 20 via pattern 31*b*, is connected to the input Main path 5 in parallel via a first resistor R1. Then, for example, a capacitance value of the first capacitor C1 is about 6 pf, and. a resistance value of the first resistor R1 is about 10 ohm.

The Peak path input matching network component 3 is arranged between the Input RF power split 1 and the composite packaged amplifier 20. The Peak path input matching network component 3 is connected to the Input RF power split 1 via a second capacitor C2, is connected to the composite packaged amplifier 20 via pattern 32*b*, is connected to the input Peak path 6 in parallel via a second resistor R2. Then, for example, a capacitance value of the second capacitor C2 is about 12 nf, and. a resistance value of the second resistor R2 is about 50 ohm.

The Final transformer 8 is connected between the Output RF path 9 and the composite packaged amplifier 20 via a third capacitor C3, is connected to the output Main and Peak Paths 7 in parallel. Then, for example, a capacitance value of the third capacitor C3 is about 6 pf.

The composite packaged amplifier 20 has a package for a bottom plate 25, a containing semiconductor dies 40*a*,40*b*, internal input matching components 10*a*,10*b*, an internal output matching circuit 4, an input metal plate 11*a*, 11*b*, an output metal plate 12. The containing semiconductor dies 40*a*, 40*b*, the internal input matching circuits 10*a*,10*b*, the internal output matching circuit 4 provided on the bottom plate 25. Then, for example, the input metal plate 11*a*, 11*b*, the output metal plate 12 and the bottom plate is made material of a Copper, and so on.

The containing semiconductor dies 40*a*, 40*b* each is connected to the internal input matching circuits 10*a*, 10*b* by wirings 51*a*, 51*b*. The containing semiconductor dies 40*a*, 40*b* each is connected to the internal output matching circuit 4 by wirings 52*a*, 52*b*. The output metal plate 12 is connected to the internal output matching circuit 4 by wirings 55. The bottom plate 25 and the metal plates 11*a*, 11*b*, 12 of the composite packaged amplifier 20 are molded by resin. Then, for example, the resin is made material of an epoxy resin, a polyimide resin and so on.

The Final transformer 8 has a third transmission line 8*a* and a fourth transmission line 8*b*. The output metal plate 12 is connected to the third transmission line 8*a* of the Final transformer 8. The input metal plate 11*b*, 11*a* each is connected to the first and second transformer 31*b*, 32*b*.

Figure 1B:
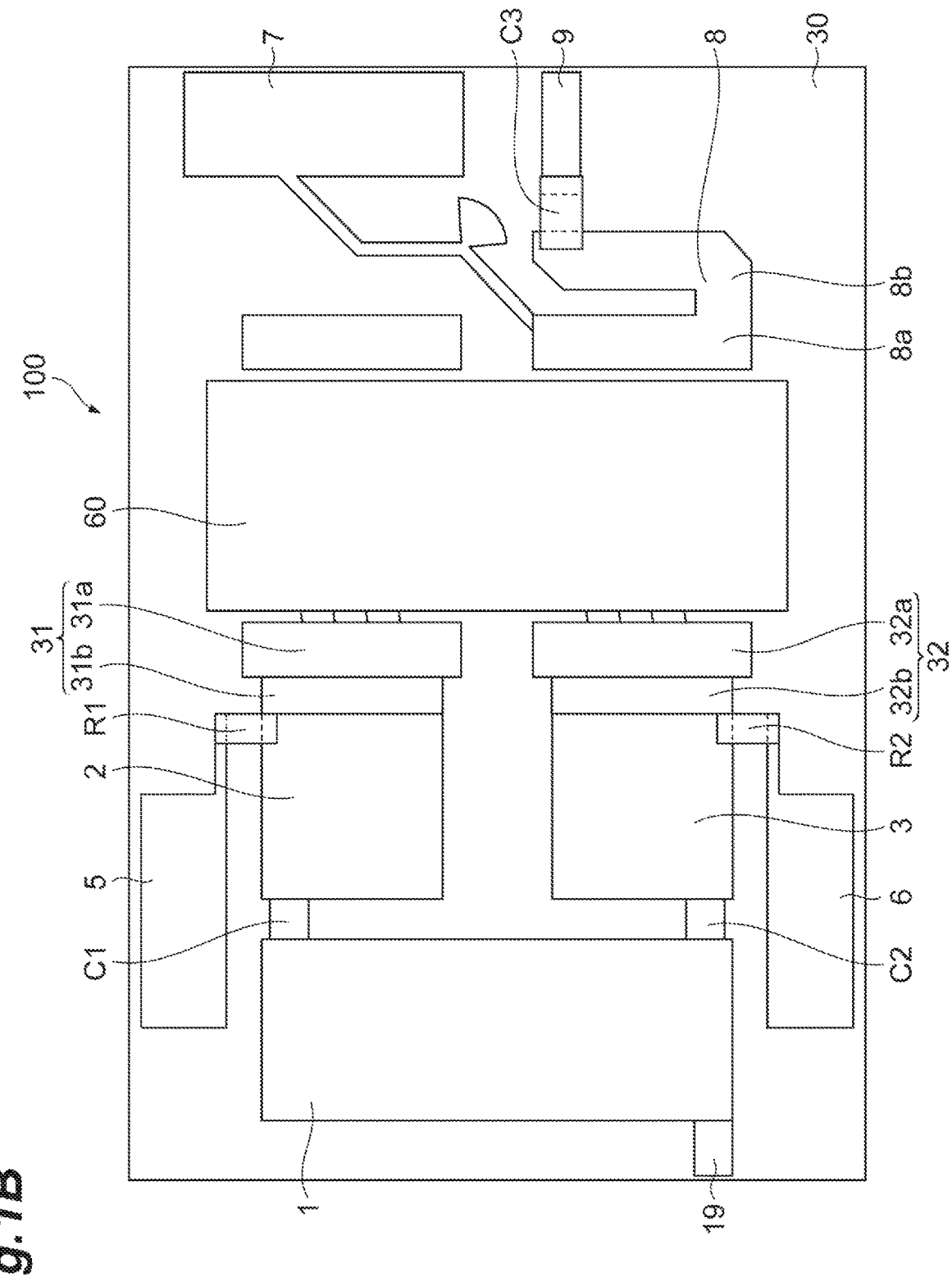
FIG. 1B shows a substrate of a composite packaged amplifier device of the present invention.

FIG. 1B shows the PCB substrate 30 of FIG. 1A, not install the composite packaged amplifier of FIG. 1A. A pattern 31, 32 has a pattern 31*a*, 32*a*, and the pattern 31*b*, 32*b*, provided on the PCB substrate 30. Then, the pattern 31*a*, 32*a* of the pattern 31, 32 will be each connected to the input metal plate 11*b*, 11*a* of the composite packaged amplifier 20.

The third transmission line 8*a* of the Final transformer 8 will be connected to the output metal plate 12 of the composite packaged amplifier 20.

A ground pattern 60 has a pattern 31*a*, 32*a*, and the pattern 31*a*, 32*b*, provided on the PCB substrate 30. Then, the ground pattern 60 will be connected to the bottom plate 25 of the composite packaged amplifier 20.

The primary objective of this invention is to provide a composite amplifier solution in a low-cost but volume manufacturable surface mount package.

The surface mount package which is selected over the conventional 'drop-in' ceramic package is primarily due to the accuracy of pick and place positioning during volume manufacturing.

However, in the particular surface mount package, in this particular example, the electrical terminals have been designed to provide a width of 1.525 mm. Equations 1a and 1b show an empirical formula for determining the characteristic impedance of a microstrip based on known dielectric material information.

When $\left(\frac{W}{H}\right) < 1$,  [Equation 1a]

Characteristic Impedance, $Z_0 = \frac{60}{\sqrt{\varepsilon_{eff}}} \ln\left(8\frac{H}{W} + 0.28\frac{W}{H}\right)$ When $\left(\frac{W}{H}\right) > 1$,  [Equation 1b]

Characteristic Impedance, $$Z_0 = \frac{120\pi}{\sqrt{\varepsilon_{eff}} \times \left[\frac{W}{H} + 1.393 + \frac{2}{3}\ln\left(\frac{W}{H} + 1.444\right)\right]}$$

Where W denotes Width of dielectric substrate and H denotes thickness of dielectric substrate and $\varepsilon_{eff}$ denotes the effective dielectric of the substrate, the forementioned equations can be used to approximate the characteristic impedance of the microstrip.

Using a fixed Width value of 1.525 mm, Table 2 shows an example of RF electrical impedances associated with standard dielectric substrates with varying thickness.

TABLE 2

| Name of Substrate | Dielectric | Dielectric Thickness | RF Electrical Impedance |
|---|---|---|---|
| Substrate A | 2.2 | 0.508 mm | 50Ω |
| Substrate B | 2.2 | 0.254 mm | 30.3Ω |
| Substrate C | 3.66 | 0.508 mm | 40Ω |
| Substrate D | 3.66 | 0.254 mm | 24.1Ω |
| Substrate E | 6.15 | 0.508 mm | 31.6Ω |
| Substrate F | 6.15 | 0.254 mm | 18.9Ω |

The length of λ/4 transformers differs with frequency (increasing length with lower frequency). Using the Doherty as the same illustration, FIGS. 2A and 2B shows how this package can be further used for different frequencies.

Figure 2A:
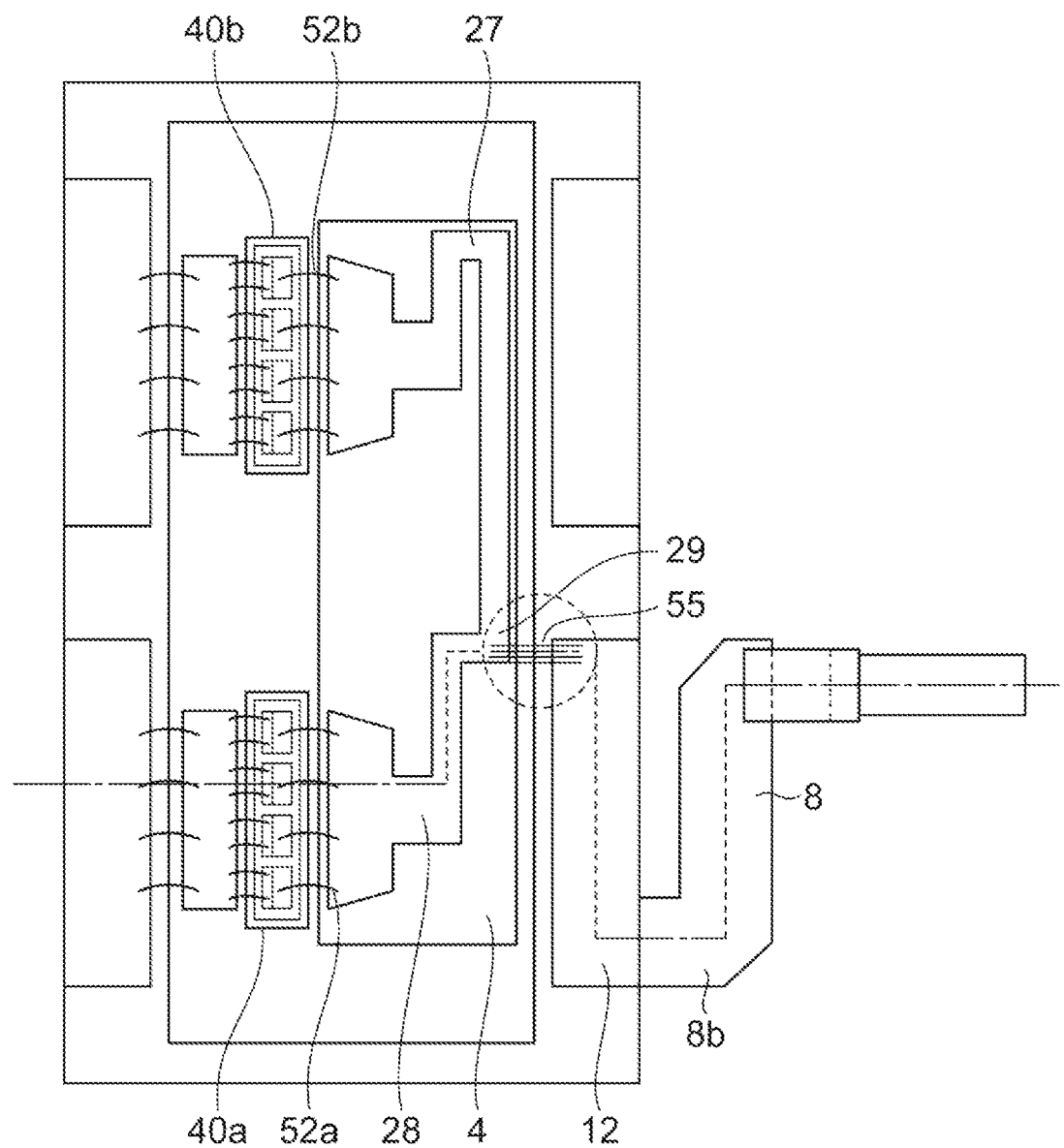
FIG. 2A shows a configuration of one embodiment of a composite packaged amplifier device.

In one embodiment illustrated in FIG. 2A, the location of the wire-bonds that inter-connects between dielectric substrate (item #4) and final transformer (item #8) is circled. The location has been selected as such in order to present the excitation of the RF signals as close to the edge of the transformer as possible.

Figure 2B:
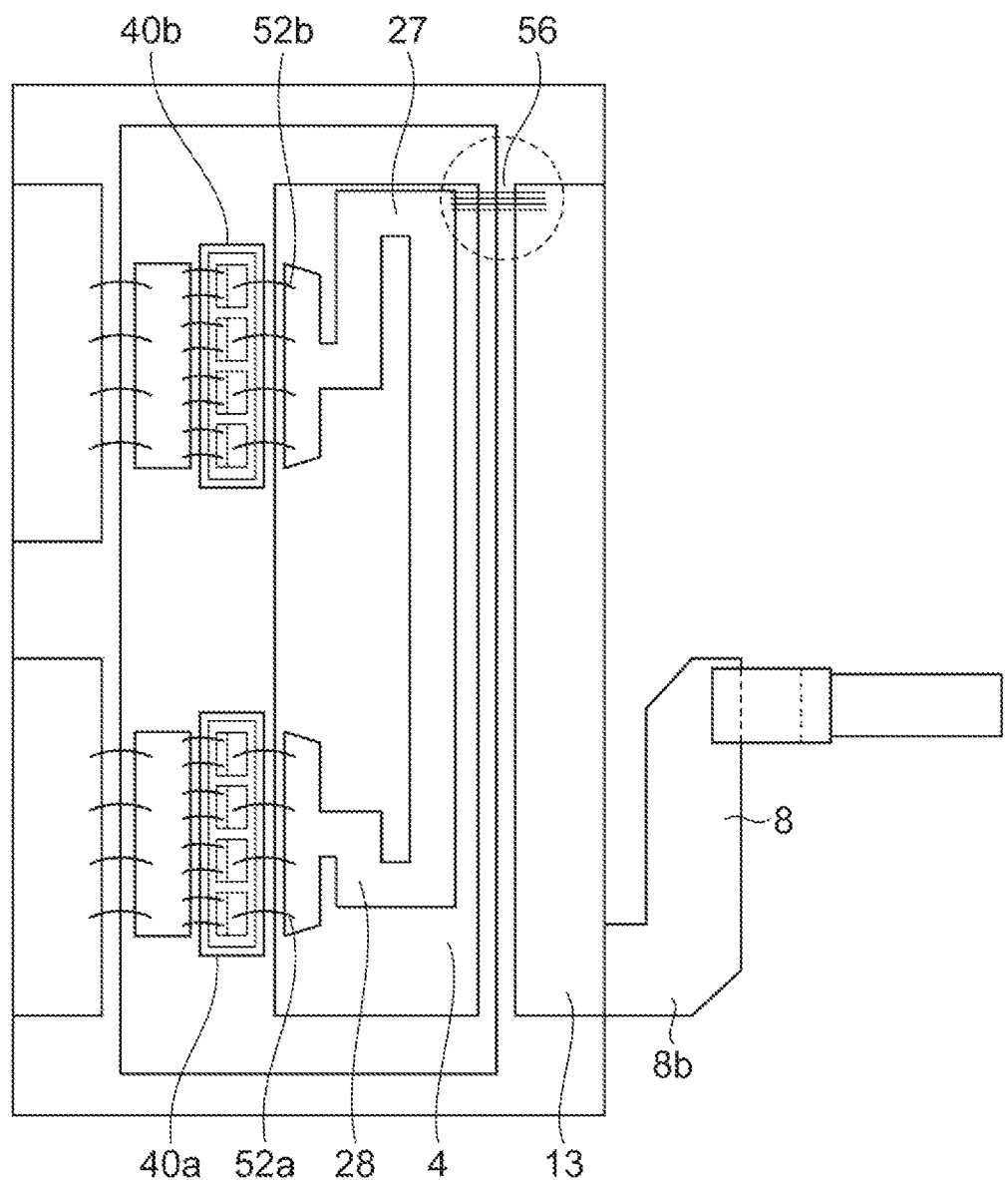
FIG. 2B shows a configuration of another embodiment of a composite packaged amplifier device.

In another embodiment illustrated in FIG. 2B, the location of the wire-bonds that inter-connects (circled) are located at the top-side edge of the package lead frame/microstrip transformer TX1. Once again, this is to ensure that the excitation of the RF is as close as possible to the edge of TX1.

FIG. 2A shows the internal output matching circuit 4 has transmission lines 27, 28 (a first and a second transmission lines) each connected to the containing semiconductor dies 40*a*, 40*b* by the wiring 52*a*,52*b*. A first area connected between the transmission lines 27, 28 of the internal output matching circuit 4, is connected to the output metal plate 12 by wirings 55. The first area is arranged on the transmission line 28 side. The wirings 55 is concentrated and bonded on the first area of the transmission line 27 and 28. The output metal plate 12 and the fourth transmission line 8b having an electrical length of less than π/4 radian for a signal subject to the amplifier. For example, the length of the output metal plate 12 corresponding to a frequency of 20 GHz, is 5 mm. Then, the length of the output metal plate 12 and fourth transmission line 8b is 20 mm. The final transformer 8 is short by using the output metal plate 12 as a microstrip line, has the third transmission line 8a and the fourth transmission line 8b. The composite package amplifier device 100 constitutes of a small device. Example of each transmission lines and each pattern are made of copper, each wiring is made of a gold so on.

FIG. 2B shows the internal output matching circuit 4 which has transmission line 27,28 each connected to the containing semiconductor dies 40a,40b by the wiring 52a, 52b. A second area connected between the transmission line 27 and 28 of the internal output matching circuit 4, connected to an output metal plate 13 instead of the output metal plate 12 by wirings 56. The second area arranged on the transmission line 27 side. The wirings 56 is concentrated and bonded on the second area of the transmission line 27, 28. The output metal plate 13 and the fourth transmission line 8b having an electrical length of less than π/4 radian for a signal subject to the amplifier. For example, the length of the output metal plate 13 corresponding to a frequency of 10 GHz, is longer than the length of the output metal plate 12 of the FIG. 2A, is 20 mm. Then, the length of the output metal plate 13 and fourth transmission line 8b is 40 mm. The final transformer 8 is short by using the output metal plate 13 as a microstrip line, has the third transmission line 8a and the fourth transmission line 8b. The composite package amplifier device 100 constitutes of a small device. Example of each transmission lines and each pattern are made of copper, each wiring is made of a gold so on.

Figure 3:
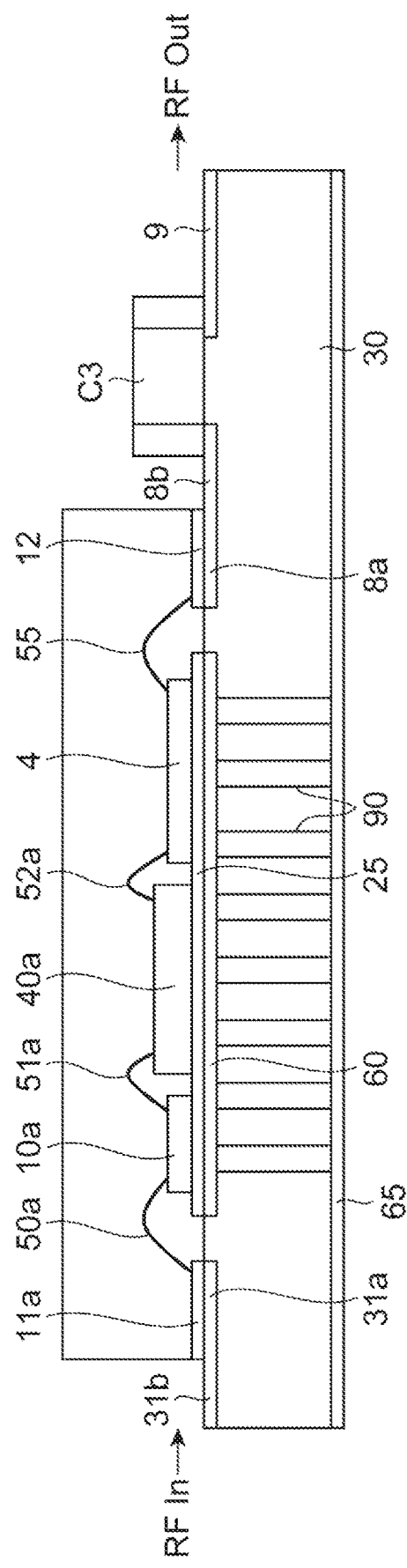
FIG. 3 shows a configuration of the cross section of one embodiment of a composite packaged amplifier device.
Figure 4:
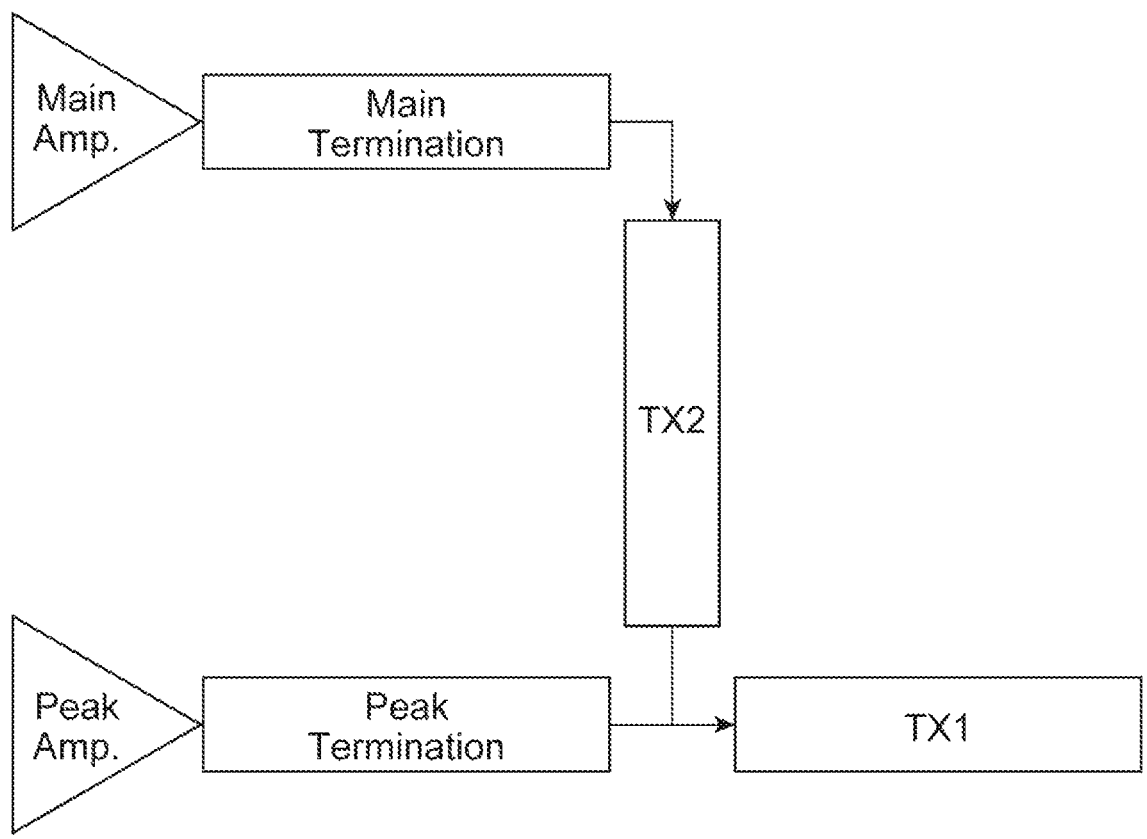
FIG. 4 shows a block diagram of a Doherty Amplifier.
Figure 5:
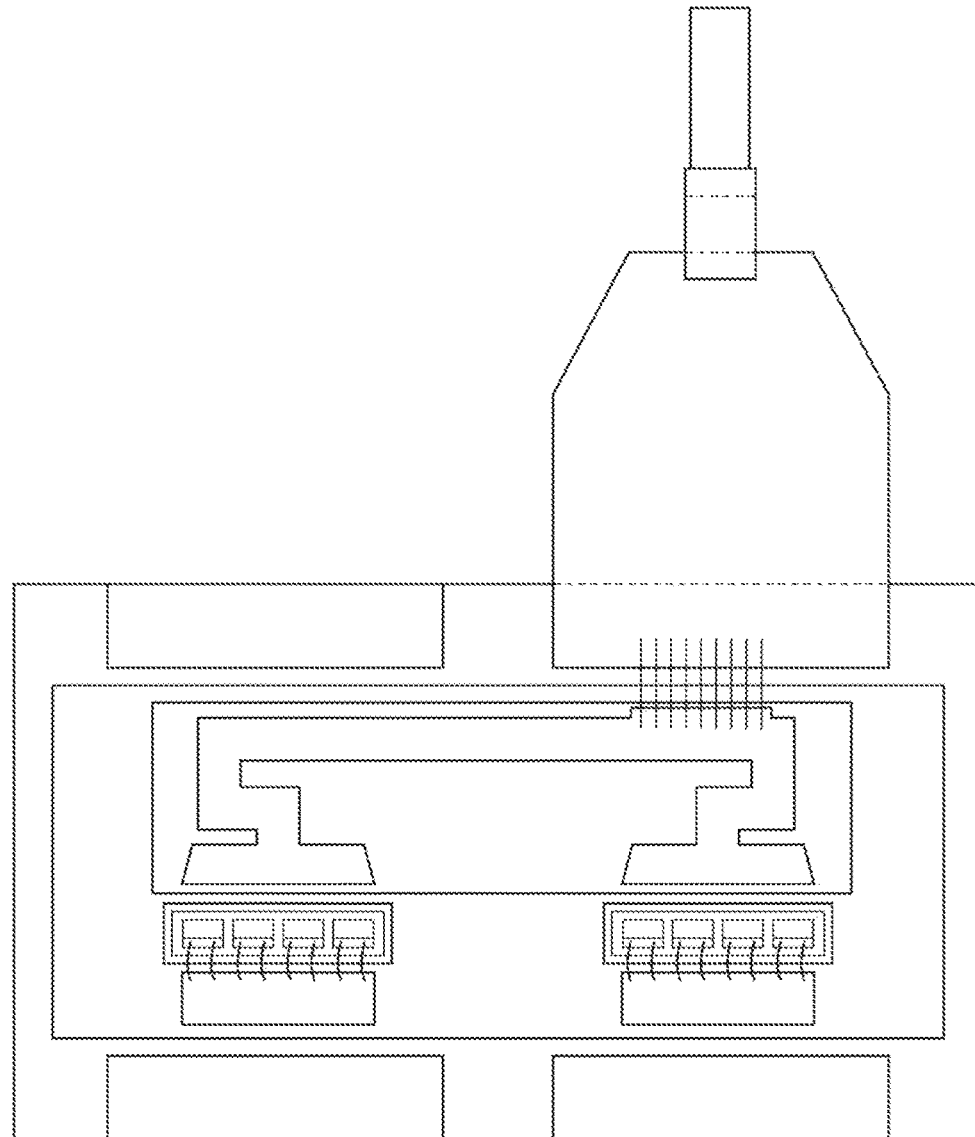
FIG. 5 shows a configuration of a composite packaged conventional amplifier device.

FIG. 3 shows a practical implementation of a Doherty amplifier device in a cross section of a composite packaged amplifier illustrated in FIG. 2A. The composite packaged amplifier 20 is provided on the PCB substrate 30. The ground pattern 60 of the PCB substrate 30 is electrically and thermally connected to the ground metal 65 of the PCB substrate 30 by via-holes 90. The output metal plate 12 is connected to the first transmission line 28 of the internal output matching component 4 by wiring 55. The output metal plate 12 is jointed on the third transmission line 8a of the Final transformer 8 by soldering. The bottom plate 25 is jointed on the ground pattern 60 of the PCB substrate 30 by soldering. Examples of each transmission line and each pattern are made of copper, each solder is made of composite of gold and tin, each wiring is made of a gold so on. The bottom plate 25 and the input metal plate 11a and the output metal plate 12 of the composite packaged amplifier 20 are molded by resin.

However, the semiconductor device according to the present invention is not limited thereto, and it may include various semiconductor devices. For example, another embodiment is a conventional amplifier device, not the Doherty amplifier device of the foregoing embodiment.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A Doherty amplifier device that amplifies an input radio frequency (RF) signal, the Doherty amplifier device having a back-off level that is smaller than a preset amount from saturated power in an output thereof, the Doherty amplifier device comprising:
   a composite packaged amplifier including a bottom plate and an output plate,
   a carrier amplifier for amplifying the input RF signal, the carrier amplifier saturating output power thereof at the back-off level, and provided on the bottom plate,
   a peak amplifier turning on at the back-off level, and saturating an output thereof at the saturated power, and provided on the bottom plate, and
   an output matching circuit having a first transmission line, a second transmission line, and a combining node that combines an output of the carrier amplifier with an output of the peak amplifier, the first transmission line being provided between the carrier amplifier and the combining node and the second transmission line being provided between the combining node and the peak amplifier; and
   a substrate having a third transmission line and an external port on a main surface,
   wherein the composite packaged amplifier is provided on the main surface of the substrate,
   wherein the third transmission line is electrically connected to the external port,
   wherein the output plate of the composite amplifier contacts the third transmission line of the substrate and overlays the third transmission line,
   wherein an edge of the output plate is connected to the combining node, and
   wherein the output plate and the third transmission line have an electrical length of equal or less than π/4 radian for a signal subject to the Doherty amplifier device.

2. The Doherty amplifier device according to claim 1, wherein the edge of the output plate is connected to the combining node by a plurality of wirings.

3. The Doherty amplifier device according to claim 1, wherein the carrier and peak amplifiers are each connected to an input matching circuit independently provided on the substrate.

4. The Doherty amplifier device according to claim 1, wherein the carrier and peak amplifiers each is connected to an input matching circuit independently in the composite packaged amplifier.

5. The Doherty amplifier device according to claim 1, wherein the third transmission line connects to the external port via a capacitance and a fourth transmission line.

6. An amplifier device that amplifies an input radio frequency (RF) signal, the amplifier device comprising:
   a composite packaged amplifier including
      a bottom plate and an output plate,
      a first amplifier and a second amplifier for amplifying the input RF signal, provided on the bottom plate,
      an output matching circuit having a first transmission line, a second transmission line, and a combining node that combines an output of the first amplifier with an output of the second amplifier, the first transmission line being provided between the first amplifier and the combining node and the second transmission line being provided between the combining node and the second amplifier; and
   a substrate having a third transmission line and an external port on a main surface, wherein the composite packaged amplifier is provided on the main surface of the substrate, wherein the third transmission line is electrically connected to the external port, wherein the output plate of the composite packaged amplifier contacts the third transmission line of the substrate and overlays the third transmission line, wherein an edge of the output plate is connected to the combining node by a plurality of wirings, and wherein the output plate and the third transmission line have an electrical length of equal or less than $\pi/4$ radian for a signal subject to the amplifier device.

* * * * *